US006764368B2

(12) United States Patent
Hasan et al.

(10) Patent No.: US 6,764,368 B2
(45) Date of Patent: Jul. 20, 2004

(54) METHOD OF FABRICATING A CATHODO-/ELECTRO-LUMINESCENT DEVICE USING A POROUS SILICON/POROUS SILICON CARBIDE AS AN ELECTRON EMITTER

(75) Inventors: Mohamed Ali Hasan, Concord, NC (US); Deirdre Heyde Elqaq, San Jose, CA (US)

(73) Assignee: University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 10/414,679

(22) Filed: Apr. 16, 2003

(65) Prior Publication Data

US 2003/0218416 A1 Nov. 27, 2003

Related U.S. Application Data

(62) Division of application No. 09/580,913, filed on May 26, 2000, now Pat. No. 6,603,257.

(60) Provisional application No. 60/136,304, filed on May 27, 1999.

(51) Int. Cl.[7] .............................. H01J 9/24; H01L 33/00

(52) U.S. Cl. ............................ 445/24; 445/50; 257/103; 257/3; 438/20

(58) Field of Search .............................. 445/24, 25, 50, 445/51; 438/20, 107, 108; 257/103, 14, 22, 16, 80, 76, 77, 88; 313/498–512, 495–497

(56) References Cited

U.S. PATENT DOCUMENTS

| | | | |
|---|---|---|---|
| 3,665,241 | A | 5/1972 | Spindt et al. |
| 3,755,704 | A | 8/1973 | Spindt et al. |
| 3,812,559 | A | 5/1974 | Spindt et al. |
| 4,792,500 | A | 12/1988 | Kojima |
| 5,317,236 | A | 5/1994 | Zavracky et al. |
| 5,432,015 | A | 7/1995 | Wu et al. |
| 5,581,150 | A | 12/1996 | Rack et al. |
| 5,598,059 | A | 1/1997 | Sun et al. |
| 5,619,097 | A | 4/1997 | Jones |
| 5,644,327 | A | 7/1997 | Onyskevych et al. |
| 5,676,578 | A | 10/1997 | Liu |
| 5,714,837 | A | 2/1998 | Zurn et al. |
| 5,908,699 | A | 6/1999 | Kim |
| 5,990,605 | A | 11/1999 | Yoshikawa et al. |

*Primary Examiner*—Joseph Williams
(74) *Attorney, Agent, or Firm*—Charles W. Calkins; Kilpatrick Stockton LLP

(57) ABSTRACT

The invention consists of a flat panel display device that combines the simplicity of manufacture of a TFEL display with the phosphor stimulation capabilities of an FED. A phosphor such a ZnS:Mn can act as both an EL phosphor and as a cathodoluminescent phosphor. The phosphor is deposited on a porous silicon underlayer that contains a labyrinth of fissures, voids, hillocks, and microscopically rough surfaces. At the phosphor-porous silicon interface, the labyrinthine surface possesses hundreds to thousands of electric field line compression points that can be characterized by an average field enhancement. When this underlayer is the cathode, high energy electrons are injected into the phosphor producing substantial light emission even at low applied fields. Additionally, the surrounding silicon is available to integrate drive circuitry and provide a TFT at each pixel, if needed.

7 Claims, 7 Drawing Sheets

Fig. 2
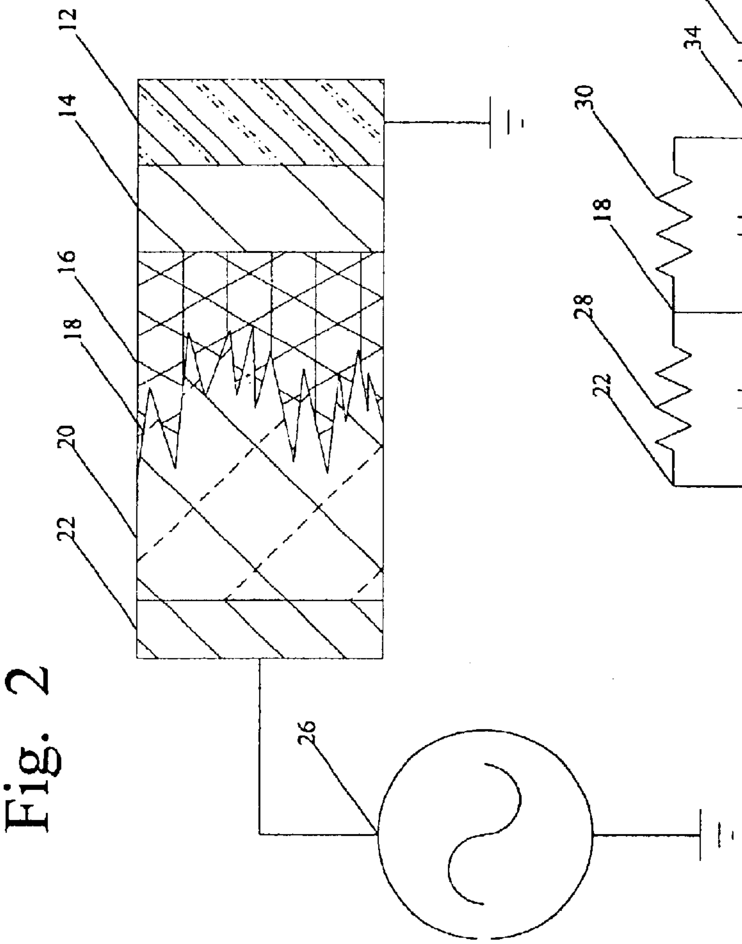
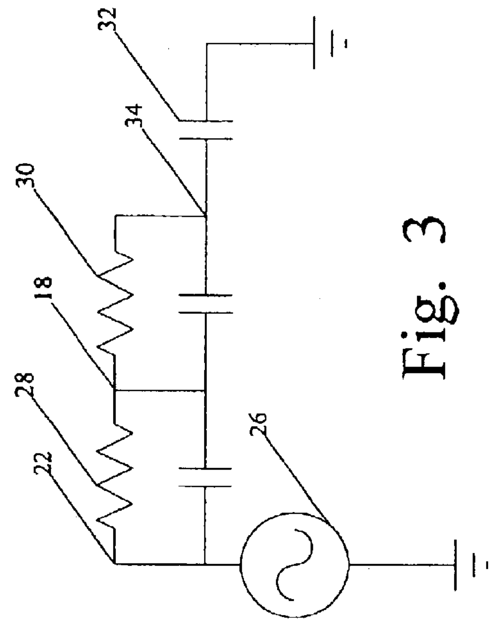
Fig. 3

– Prior Art –

METHOD OF FABRICATING A CATHODO-/ELECTRO-LUMINESCENT DEVICE USING A POROUS SILICON/POROUS SILICON CARBIDE AS AN ELECTRON EMITTER

CROSS REFERENCE OF RELATED APPLICATION

This application is a divisional application of ending application Ser. No. 09/580,913 filed May 26, 2000, now U.S. Pat No. 6,603,257 which claims the benefit of U.S. Provisional Application No. 60/136,304 filed May 27, 1999.

FIELD OF THE INVENTION

The present invention relates to field effect electron emitters and an improved method for forming field-effect electron emitters, a form of cold cathode electron emitters for a cathodo-/electro-luminescent flat panel display.

DESCRIPTION OF THE RELATED ART

A cathodoluminescent field-effect flat panel display consists of a two-dimensional cold cathode with a matrix addressing scheme constructed above the cathode whereby electrons may be allowed to selectively flow with an intensity determined by the matrix addressing scheme to a distally disposed, phosphor-bearing, anodically-biased plate. The display is termed "field effect" because the source of electrons arises from an array of needle-like emitters (from one to several hundred per picture element, or pixel). A positive potential is applied between the first electrode in the addressing scheme and the needle-like emitters or cold cathode structures. The mechanical shape of the needle-like structure produces a compression of equipotential lines and, therefore, an enhancement of the electric field at the tip of the structure by many orders of magnitude. This enhancement is sufficient for the emission of electrons. The material itself, especially its work function, is important to predict the effect. Electrons experience an acceleration through an electric field that is maintained between the matrix addressing scheme and the anodic plate of the device. The anode consists of an array of cathodoluminescent phosphors. Generally, these phosphors are deposited within a black matrix and the entire layer is covered with an aluminum film, very similar to the construction of the face plate of a color cathode ray tube (CRT) however no shadow mask is involved.

As is usual in flat panel displays, the drive electronics present a register of signals, one signal for each picture element in a scan line, to vertically disposed matrix lines. Each signal is modulated either in amplitude or duration or both to effect the luminance level desired. For full color, triplexes of phosphors emitting red, green and blue are addressed. Once the scan line is serviced, the data is replaced by the data appropriate to the second scan line. This line is selected and the data applied. This operation continues until all scan lines have been serviced. To avoid the perception of flickering light, the time allowed to service all scan lines is in the order of 10 to 15-milliseconds. If the phosphorescence is short, each pixel must be restimulated in a shorter time. An alternative is to fabricate a storage means at every pixel. Generally, this is done by fabricating a thin film field effect transistor at every pixel. This electronic storage thereby compensates for the lack of phosphor or other electro-optical persistence. As yet, this alternative is employed commercially only in liquid crystal displays called "TFT-LCD"s.

Cathodoluminescent phosphors generally demonstrate both direct luminescence when light is emitted while the phosphor is being driven, and phosphorescence when the metastable phosphor returns to ground state after stimulation. Photons are emitted as electrons fall back into lower energy orbitals. The timing of these effects and human eye physiology determines the maximum time allowed to service all scan lines. The reciprocal of this time is the refresh rate, the number usually reported in display literature. At some point, long phosphorescence times become undesirable because images, intended to change dynamically, smear.

Additional important considerations arise from considering the useful service life of the device. Phosphors exhibit coulomb-aging. Each phosphor material is characterized by the total number or coulombs that the material can accept to lose half its emission efficiency. From this point of view, using higher voltage phosphors at low current for a given energy is better than using lower voltage, higher current phosphors. Ideally, a field effect device (FED) uses CRT phosphors that benefit from 60 years of development. These phosphors have useful lives of up to 20,000 hours of operation. Unfortunately, CRT phosphors operate at high voltage (greater than 6,000-volts). This creates an engineering problem. The anodic plate must be distally disposed farther from the cathode/grid structure. Holding the anodic plate in appropriate position requires intervention to focus electron bundles and spacer members with challenging aspect ratios. The spacer members must be tens of millimeters high but roughly 0.025 millimeters in cross section.

Seminal work in cold cathodes was reported by Spindt et al., in "Physical Properties of Thin-film Field Emission Cathodes with Molybdenum Cones," Journal of Applied Physics, Volume 47, No. 12, December 1976, pages 5248–5263. Spindt et al., discuss field emission cathode structures in U.S. Pat. Nos. 3,665,241, 3,755,704, and 3,812,559. The flat panel display industry refers to the process that produces arrays of molybdenum cones as described by Spindt et al., as the Spindt process. This process demonstrates the availability of currents in the range of 50–150 microamperes per cone. The service life of emitters using the Spindt process can be limited by ion polishing of the cones. The electric field at a sharp tip is inversely proportional to the radius of the tip. Extremely sharp tips with a radius of tens of nanometers may be dulled to a radius in the hundreds of nanometers by suffering ion impact, or sputtering. It is important to maintain a high quality vacuum in an FED to minimize this effect. Molybdenum has a work function on the order of 4.5 to 5 eV, and therefore, offers no enhancement of the emission effect due to work function.

An example of a method of enhancing the efficiency of a needle-like cold cathode array is given in U.S. Pat. No. 5,908,699 ('699) entitled "Cold cathode electron emitter and display structure". The '699 reference discloses the use of nano-crystalline carbon to create a robust needle-like tip. However, carbon has a relatively high work function (about 5 eV) and therefore, such displays require relatively high potential differences between the cathode needles and the addressing matrix electrode. With the introduction of cesium as a cathode material in '699, the effective work function is reduced to the order of 1.05 to 1.3 eV, dramatically reducing the operating voltages (e.g., on the order of 4 or 5 to 1). However, cesium is a difficult material. Cesium tends to act as a scavenger in vacuum devices. In fact, cesium is often introduced into vacuum devices as a getter. Cesium is difficult to handle in manufacturing since it is unstable in air. While a low work function material seems highly desirable, cesium may not maintain its properties over the required lifetime of the cathode.

Certain phosphors, for example, ZnS:Mn, emit light when stimulated by an electric field. This phenomenon is called electroluminescence and the flat panel displays predicated on this phenomenon are called electroluminescent displays (EL). Commercial devices are made in two basic ways: (1) powder EL generally uses a thick phosphor layer in a direct current grid work and (2) thin film EL generally uses a layered structure that includes a thin film of EL phosphor and at least one transparent insulator, for example yttrium oxide ($Y_2O_3$), in a conductive cross grid. Both structures, powder and thin film EL, are simple, and the display is fabricated on a single insulating plate. Since the luminance arises only in the driven phosphor, one of the conductive electrodes must be substantially transparent. Usually, indium tin oxide (ITO) is used for the transparent electrode. A typical vertical structure is ITO, $Y_2O_3$, ZnS:Mn, $Y_2O_3$, and Al. Usually, ITO forms vertical lines and aluminum forms horizontal lines. If Al is deposited first, a transparent cover plate is needed, and the initial insulated plate need not be transparent. If ITO is deposited first, the substrate must be transparent. This type of display is commonly referred to as "acTFEL", meaning a thin film electroluminescent display that uses an alternating current (ac) drive. The phosphor layer is usually about 0.5 to 2 $\mu$m thick. The other layers are in the range of 200 nm thick. The layers are fabricated using conventional thin film deposition techniques such as e-beam deposition or sputtering and, more recently, by atomic layer epitaxy (ALE).

The acTFEL device is somewhat more efficient than the dc powder device and enjoys a greater state of development. Electrically, an acTFEL device exhibits a threshold voltage in the neighborhood of 150 to 175 volts rms. Below this voltage, this device does not emit light. In perhaps a voltage difference of 20-volts rms above threshold, the luminance of a cell may rise from 1 cd/$m^2$ to 800 cd/$m^2$. The highest luminance is usually quite uniform. This makes the technology an easy candidate for an on/off display for displaying graphics and alphanumerics. The luminance also depends on the frequency of the ac drive. For low frequencies, the luminance is linearly related to frequency. At a frequency that depends on structural nuances, the luminance falls off above a peak. The voltage impressed across the phosphor is given by:

$$V_{phos} = \frac{\epsilon_{phos} \times t_{diel} \times V_{applied}}{\epsilon_{phos} \times t_{diel} + \epsilon_{diel} \times t_{phos}}$$

Where:

$V_{phos}$ is the voltage across the phosphor, $\epsilon_{phos}$ is the dielectric constant of the phosphor (about 9.6 for ZnS), $t_{diel}$ is the thickness of the dielectric, $V_{applied}$ is the applied voltage, $\epsilon_{diel}$ is the dielectric constant of the dielectric, e.g., yittria about 4, $t_{phos}$ is the thickness of the phosphor layer.

For a lower voltage device, these quantities should be adjusted to have a coefficient that approaches one. This must be achieved with a sufficient guard band for the dielectric strength of each layer.

The problems with EL have historically been: 1) "remanence" in which an old image is still visible when the intent is to replace the old image with a new image; 2) the lack of a convincing blue-emitting phosphor; 3) the inability of the technology to produce gray scales smoothly; and, 4) poor luminance. Ideally, one would like off, level 1 and then 15 log steps above level 1. Historically, EL has not been able to hold level 1, at least in conventionally scanned panels. Level 1 is too big a step (for example 20% of maximum luminance) and is unstable in both time and physically across the panel. The luminance problem comes from multiplexing. A 768 scan line panel cell emits light only 1/768th of the time. Even so, approximately satisfactory monochrome ZnS:Mn panels show 20 to 30 cd/$m^2$ at such multiplex ratios and convenient refresh rates. International standards (e.g., ISO 9241, part 3, ISO 13406, part 2 and the European Union counterparts CEN 29241, part 3 and so forth) call for a minimum of 35 cd/$m^2$, a realistic minimum is 100 cd/$m^2$. The luminance level is also exacerbated by specular reflectance of the aluminum electrodes. In an ordinary room, one must account for the loss of contrast due to reflected specular sources (see ISO 9241, part 7 for a measurement method and criteria). Often, this problem results in the use of a circular polarizer between the viewer and the display. This reduces the luminance by a factor of more than 2.

Remanence is thought to be caused by charge trapping in the relatively poor quality dielectrics that are realized by e-beam and like thin film deposition techniques. The quality of EL dielectrics is poor compared with insulator systems used in the semiconductor industry that are grown with well-controlled processes using exotic tools. Semiconductor industry insulators are essentially free from trapping centers and may be used with a unipolar bias for 100,000 hours or more. The remanence problem was greatly improved by using drive schemes that seem to guarantee that no average voltage exists across the dielectric-phosphor laminate. However, such remedy was not completely successful.

Multicolor displays are now mandatory in most commercial markets, albeit not required to operate most commercial applications. Blue-emitting phosphors have been invented, but have relatively poor efficiency. A reasonable solution to using these phosphors would be the use of local pixel content storage. The obvious way to achieve this is using thin-film-transistors (TFT-TFEL) at every pixel. Reliable TFTs in the voltage range are still not available.

The precision and stability of the threshold level have been addressed by combining amplitude and pulse-width modulation on the pixel data lines. Threshold stability problems are understood by reviewing some typical numbers. A panel may have a threshold of 175 volts rms. Above this threshold, the luminance increases logarithmically, an order of magnitude increase per 5 volts. As a percent of threshold, 5 volts is less than 3%. In other words, the expected luminance can change by a factor of ten if the threshold nonuniformity is 3%. It is difficult to hold such precision on a large part of this kind. This problem would also be ameliorated by a TFT-TFEL design. The objective of every flat panel display has been to match CRT performance. Since TFT-LCDs are in substantial production, investment in solving these problems in EL have waned. The widely used TFT-LCD panel uses a photoluminescent back light that is highly efficient, but only about 5% of that lamp luminance reaches the eye of the user because of characteristics of the LCD/color filter light valve.

What is therefore needed is a flat panel display that has neither the intractable mechanical problems with field emitter cathodoluminescent displays nor the problems that continue to plague electroluminescent displays. Further needed is a flat panel display having the relative efficiency of displays that stimulate phosphor. Further needed is a method of manufacturing/fabrication of cathodoluminescent/electroluminescent devices for use in flat panel displays that operate a lower voltage and lower frequency than conventional devices.

SUMMARY OF THE INVENTION

The invention is a flat panel display device having the phosphor stimulation capabilities of an FED. The flat panel device has the simplicity of manufacture of a TFEL display. A phosphor such a ZnS:Mn can act as both an EL phosphor and as a cathodoluminescent phosphor. The phosphor is deposited on a porous silicon underlayer that contains a labyrinth of fissures, voids, hillocks, and microscopically rough surfaces. At the phosphor-porous silicon interface, the labyrinthine surface possesses hundreds to thousands of electric field line compression points that can be characterized by an average field enhancement. When this underlayer is the cathode, high energy electrons are injected into the phosphor producing substantial light emission even at low applied fields. Additionally, the surrounding silicon is available to integrate drive circuitry and provide a TFT at each pixel, if needed.

OBJECTS OF THE INVENTION

The object of the invention is to provide a display device having the simplicity of manufacture found in TFEL display technology but without the characteristic high voltage and highly unstable threshold level.

Another object of this invention is to provide an electro-optical transducer embodied in a flat panel display that exhibits the efficiency of cathodoluminescence but does not require intractable mechanical structures to distally dispose an anodic plate from a needle-like cold cathode.

BRIEF DESCRIPTION OF THE DRAWINGS

The foregoing and other objects will become more readily apparent by referring to the following detailed description and the appended drawing in which:

FIG. 2 is a cross schematic of an electric test apparatus having the picture element shown in FIG. 1.

FIG. 3 is a diagram of an electric circuit representing the picture element in the test apparatus shown in FIG. 2.

DETAILED DESCRIPTION

Figure 1:
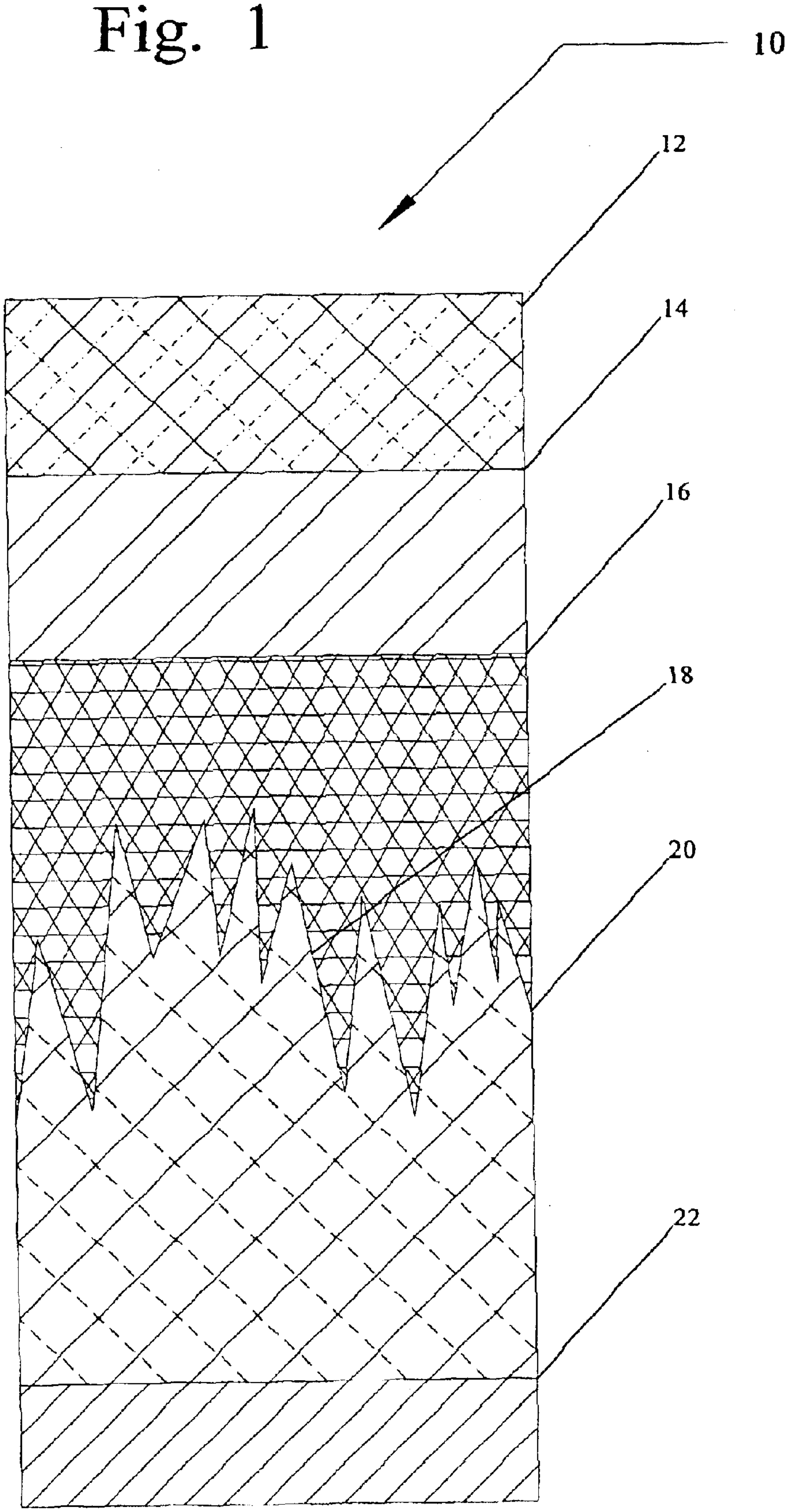
FIG. 1 is a cross section view of a portion of a picture element according to the present invention.

Referring to the drawings, FIG. 1 is a cross section view of a portion of a picture element 10 according to the present invention. Light generated in the cell passes through a transparent conductive layer 12, or transparent conductor. The transparent conductive layer 12 may be formed using conventional methods into a set of transparent conductive lines of indium tin oxide (ITO). This conductive layer 12 is transparent to visible light with a sheet resistance in the range of about 30 to 100 ohms per square. The layer 12 can form a portion of the grid lines whose intersection defines the picture elements or may be operatively connected to the drain of a thin film transistor in the case where electrical storage is provided for each individual picture element. ITO can be deposited with known techniques, for example, magnetron sputtering. The conductive layer 12 can be patterned with conventional photolithographic techniques, but is sometimes patterned ablatively using a laser.

In an alternating current (ac) embodiment of the invented device, the next layer encountered is an insulator 14. The insulator 14 may be yttrium oxide, silicon dioxide, aluminum oxide, silicon nitride or the like. The insulator 14 is preferably deposited onto the conductive layer 12 with an e-beam coater or by sputtering. The next layer is a phosphor 16 having activators and energy gaps such that the phosphor 16 emits the desired color when stimulated. For example, a ZnS:Mn phosphor emits yellow. While it is desirable to have uniform geometry for the red, green and blue emitting phosphors in a multicolor display, a weak emitting phosphor is sometimes partly compensated by devoting a large share of the picture element area. The phosphor 16 can be deposited using a CVD technique such as atomic layer epitaxy. The phosphor 16 is deposited onto porous silicon (Si) 20. The surface of the porous silicon 20 that confronts the phosphor consists of a labyrinth 18 of fissures, voids, hillocks, and microscopically rough surfaces.

A very clean, irregular surfaced porous silicon 20 is preferably formed using an anodization process wherein porous silicon is made by anodization of single crystalline silicon wafers in a mixture of hydrogen fluoride (HF) and ethanol ($C_2H_5OH$) under various current/HF concentration/time conditions. In large structures of this kind, the silicon layer may be deposited as an amorphous film using CVD and then thermally processed to result in a polysilicon layer. Smaller displays may be built directly on a silicon wafer. Porous Si is made of 20 to 80% of interconnected pores in an otherwise single-crystalline Si skeleton. In some cases, the surface of the porous silicon 20 may be hardened by growing a thin layer of silicon carbide on the porous silicon.

The final layer encountered is a metal layer 22 that is preferably made of aluminum (Al). The material can be deposited with most vacuum vapor deposition coaters, such as e-beam, sputtering, or resistance evaporation. Before the deposition of the metal layer 22, the whole structure may be annealed at approximately 500° C. under a nitrogen atmosphere to activate the phosphor layer 16 and improve the stoichiometry of the transparent conductor layer 12.

FIG. 2 is a schematic of an electric test apparatus having the picture element shown in FIG. 1. The structure from FIG. 1 has been incorporated in a simple test circuit. A voltage generator 26, or source, causes the metal layer 22 to vary in voltage with respect to the transparent conductor 12. The applied voltage may have a sinusoidal wave shape and may be variable in both frequency and amplitude. A response surface may be acquired that characterizes a resulting pixel by recording the luminance versus amplitude and frequency of the applied voltage.

FIG. 3 is a diagram of an electric circuit representing the picture element in the test apparatus shown in FIG. 2. The voltage generator 26 is operatively connected to a node 22 that is preferably the metallic layer 22. The silicon/porous silicon, and optionally silicon carbide, structure is represented by a first resistor/shunting capacitor, shown generally at 28. At low frequencies, the resistor may be neglected. The substantial intrinsic silicon acts as a capacitor. The phosphor 16 is represented by a second resistor/shunting capacitor, shown generally at 30. At low frequencies, the capacitor dominates and the overall equivalent circuit is a simple capacitive divider. This situation remains until the frequency of the voltage source 26 reaches about 500 Hz. At this point, the phosphor 16 begins to appear shunted by a frequency-dependent resistor. The electron injection phenomenon begins to fall off. At 5 kHz, injection has apparently ceased. The response surface is substantially different from the response surface of an EL cell. The luminance output apparently lacks a threshold altogether or if a threshold exists, such threshold is well below 40 volts in comparison with EL that has a typical threshold of 175 volts. When the drive voltage is on a negative half cycle, the labyrinth 18 of fissures, voids, hillocks, and microscopically rough surfaces in the surface confronting the phosphor injects high energy electrons by virtue of the electric field line compression surrounding the labyrinth 18 of fissures, voids, hillocks, and microscopically rough surfaces.

Figure 4:
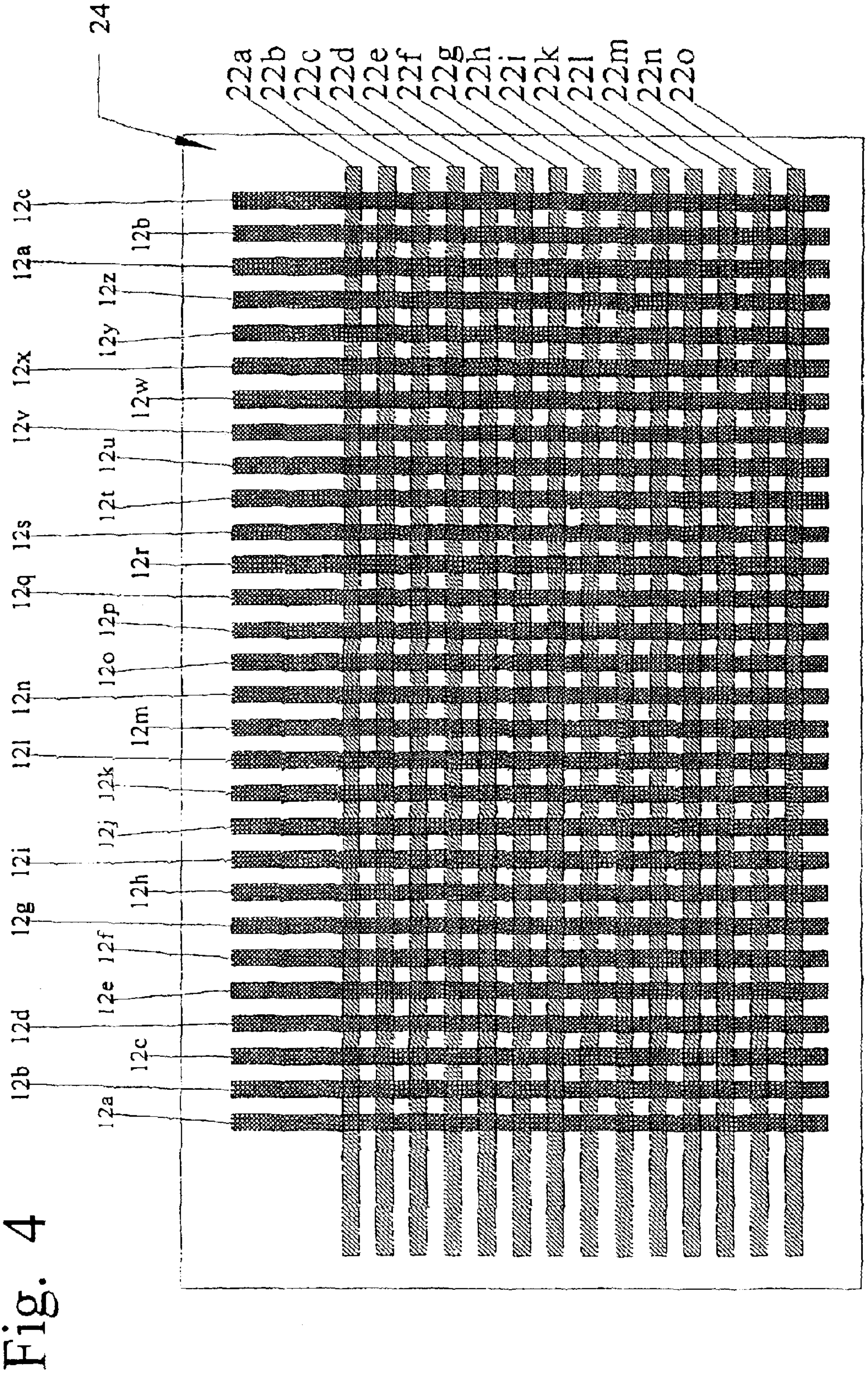
FIG. 4 is a display of picture elements on a substrate according to the present invention.

FIG. 4 is a display of picture elements on a substrate according to the present invention. FIG. 4 shows a typical grid pattern for a flat panel display. Generally, shorter electrode runs 12 are vertical and so it is common to use the transparent conductors in that direction for simple scanned devices. Both conductors may be a highly conductive metal with thin film field effect transistors (TFTs) at cross points. Typical matrices of commercial interest are 480 (row conductors) by 640 (column conductors), 600 by 800, 768 by 1024, and 1024 by 1344. The matrix in the present invention is substantially formed on a single substrate, shown generally at 24. The existence of silicon on the substrate 24 presents the opportunity to simply add drive circuitry to the base display. Without drive circuitry, the number of connections to the panel must be the sum of those pairs of numbers, e.g., 600+800=1400 connections. If drive circuitry is integrated, the number of connections reduces to about 20 for any panel configuration.

Figure 5:
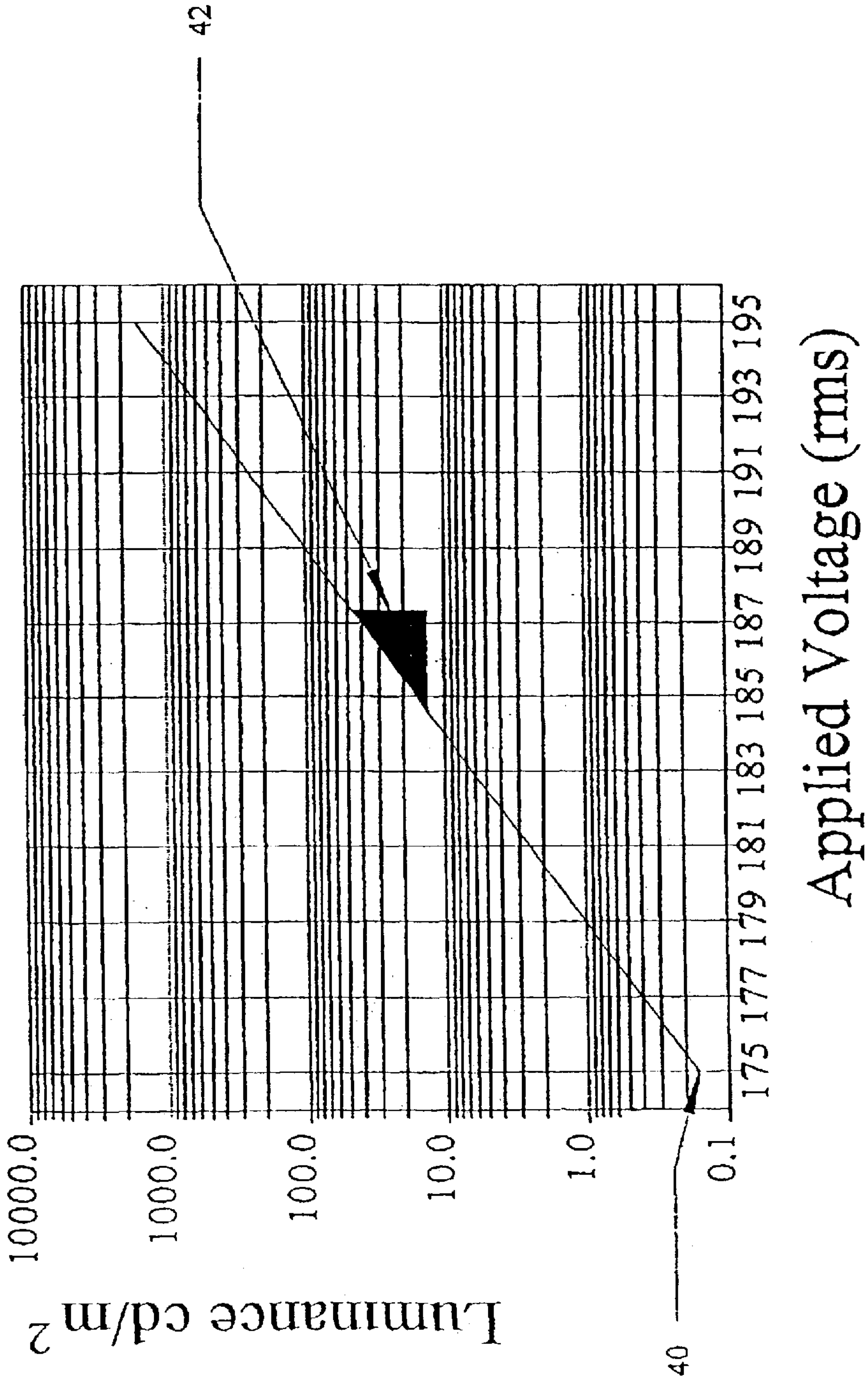
FIG. 5 is a graph of luminance versus voltage of a known acTFEL display.

FIG. 5 is a graph of luminance versus voltage of a known acTFEL display. FIG. 5 shows a typical cell response for an EL panel. The threshold 40 is approximately 175 volts rms. The slope 42 is equivalent to: $Y(V)=10\times Y(V-5)$ for $V>180$ volts; where V is the rms applied voltage and Y is the luminance response in $cd/m^2$.

Figure 6:
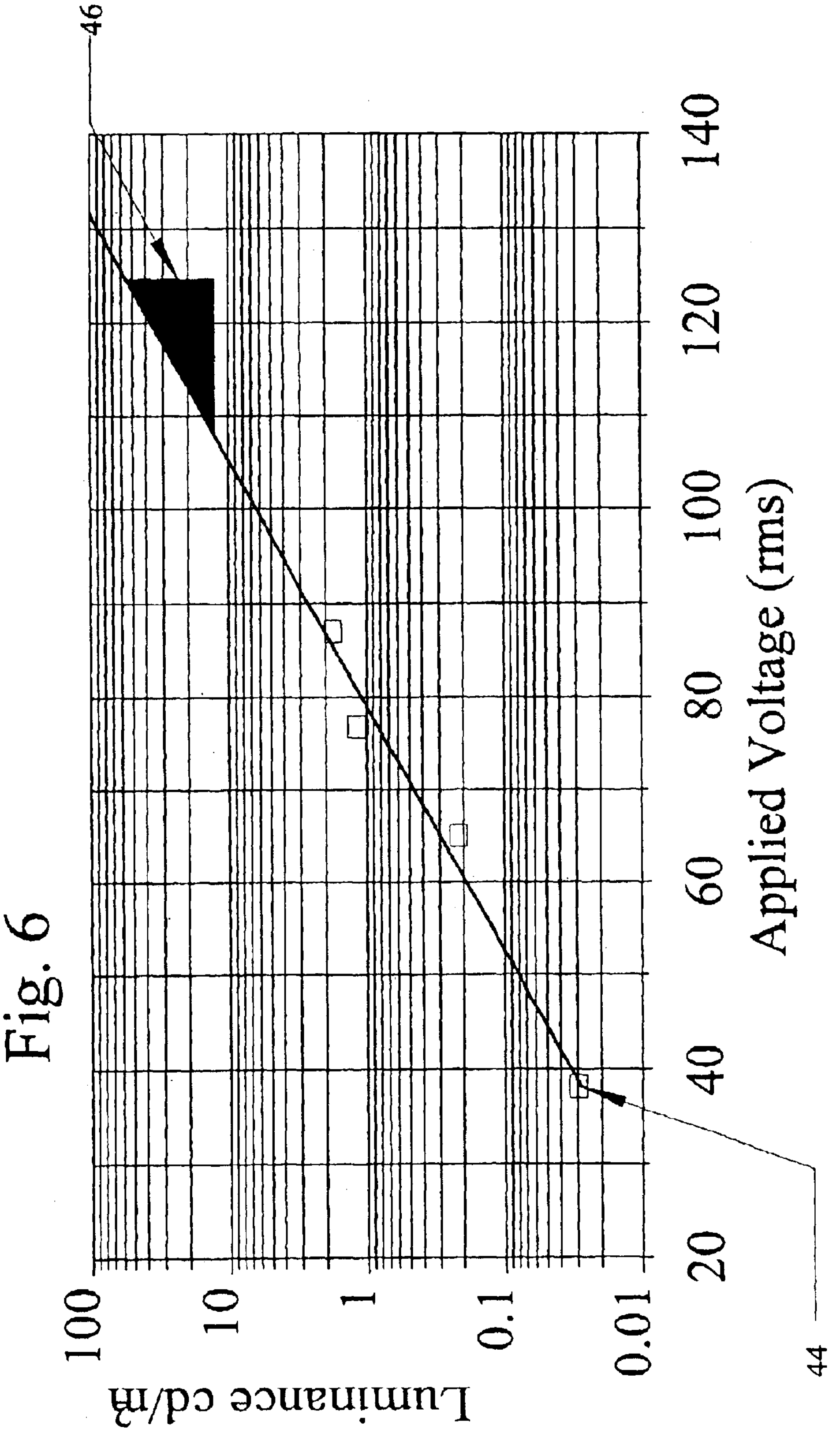
FIG. 6 is a graph of luminance versus voltage of a display according to the present invention.

FIG. 6 is a graph of luminance versus voltage of a display according to the present invention. FIG. 6 shows the response of a cell that is fabricated according to the present invention. The threshold 44 is approximately 30-volts rms. The slope 46 is equivalent to: $Y(V)=10\times Y(V-25)$ for $V>35$-volts; where V is the rms applied voltage and Y is the luminance response in $cd/m^2$. The required precision and uniformity implied by these results is substantially less stringent than the known acTFEL display shown in FIG. 5. The box symbols represent data points. All data in this figure was obtained at 125 Hz.

Figure 7:
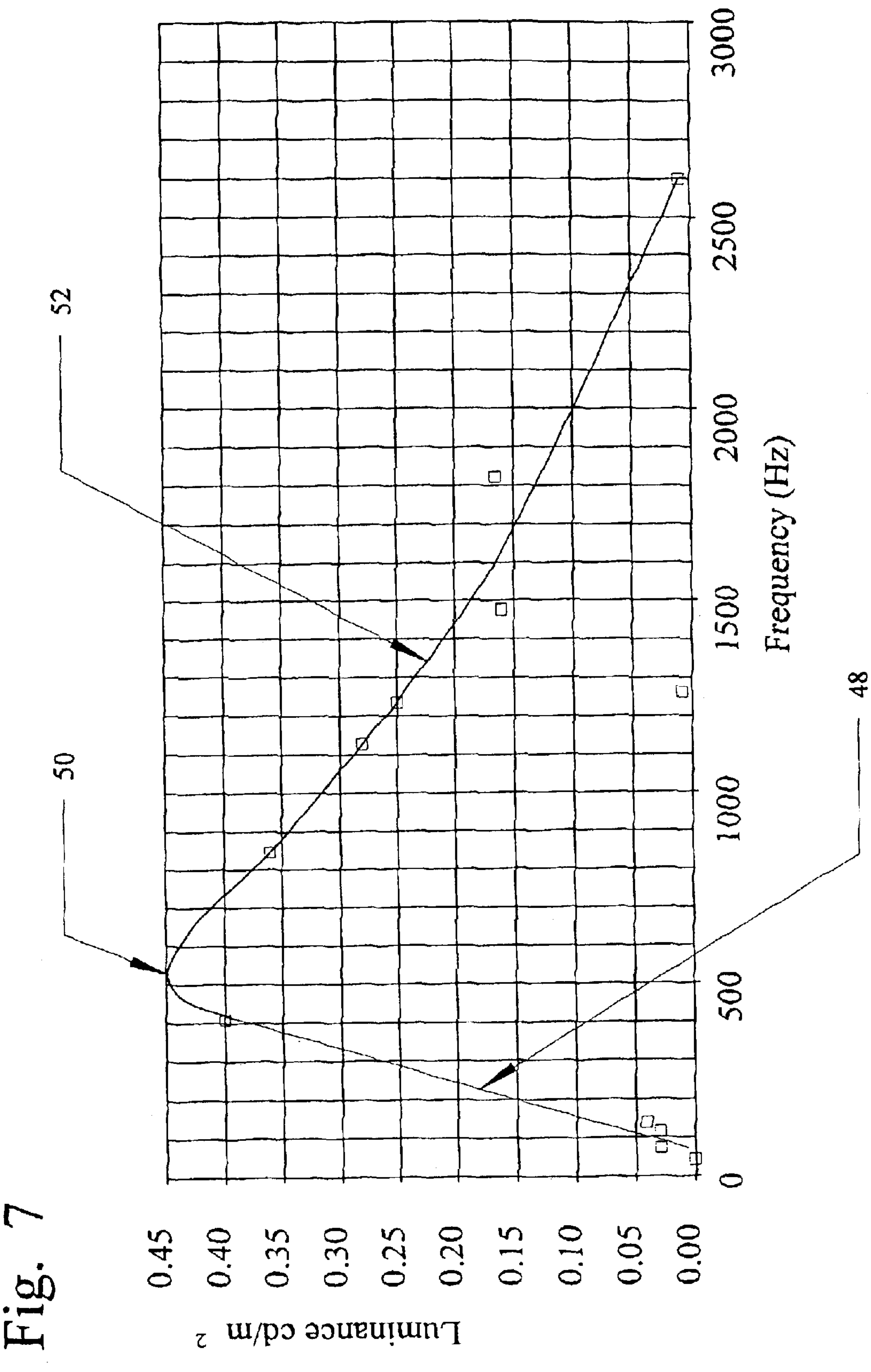
FIG. 7 is a graph of luminance versus frequency of a display according to the present invention.

FIG. 7 is a graph of luminance versus frequency of a display according to the present invention. FIG. 7 shows the frequency response of a cell fabricated according to the present invention. There is a linear regime 48 where the luminance approximately doubles for a doubling of frequency. This is nothing more than light pulse counting. Just above 400 Hz, the linear characteristic is lost. The amplitude of the light pulses are decreasing fast enough that the increased pulse counts are overwhelmed and the luminance begins to decrease. The applied voltage was about 61 volts rms, while the frequency was varied between about 0 and 3 kHz. Light was detected at frequencies as low as 45 Hz and became undetectable above about 2.7 kHz while maximum light intensity was obtained in a range of about 407 Hz to about 843 Hz.

Figure 8:
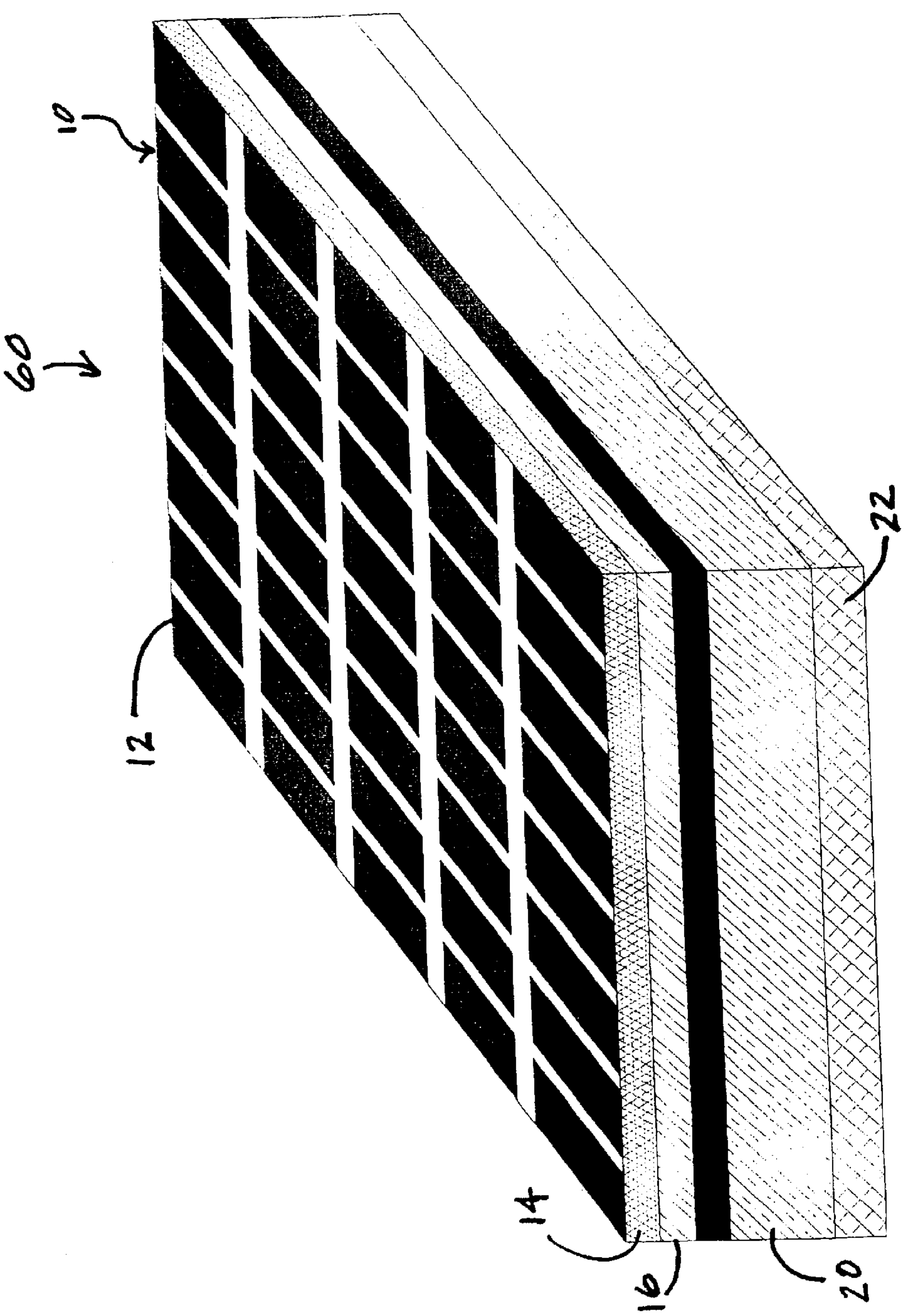
FIG. 8 is a perspective view of a flat panel display in accordance with the present invention.

FIG. 8 is a perspective view of a flat panel display, shown generally at 60, in accordance with the present invention. The display 60 includes a plurality of matrix-addressable display devices or previously mentioned picture element 10.

SUMMARY OF THE ACHIEVEMENT OF THE OBJECTS OF THE INVENTION

From the foregoing, it is readily apparent that we have invented a display device that exploits the simplicity of manufacture of the TFEL display technology but without the characteristic high voltage and highly unstable threshold level. The present invention provides an electro-optical transducer embodied in a flat panel display that exhibits the efficiency of cathodoluminescence but does not require intractable mechanical structures to distally dispose the anodic plate from a needle-like cold cathode.

It is to be understood that the foregoing description and specific embodiments are merely illustrative of the best mode of the invention and the principles thereof, and that various modifications and additions may be made to the apparatus by those skilled in the art, without departing from the spirit and scope of this invention, which is therefore understood to be limited only by the scope of the appended claims.

What is claimed is:

1. A method for fabricating a cathodoluminescent/electroluminescent device, said method comprising:

- forming a transparent conductive layer;
- depositing an insulator onto the transparent conductive layer;
- forming a porous silicon layer from crystalline silicon wafers;
- depositing a phosphor onto the insulator;
- forming an intermediate device by positioning the porous silicon layer so that a porous surface of the porous silicon layer is adjacent the phosphor;
- annealing the intermediate device; and
- depositing a metal layer on a non-porous surface of the porous silicon layer.

2. The method in accordance with claim 1, wherein said forming a conductive layer step includes depositing conductive grid lines of indium tin oxide onto a substrate.

3. A method in accordance with claim 1, wherein said depositing an insulator step includes selecting an insulator from the group consisting of yttrium oxide, silicon dioxide, aluminum oxide, and silicon nitride.

4. A method in accordance with claim 1, wherein said forming a porous silicon layer includes anodizing a single crystalline silicon wafer in a mixture of hydrogen fluoride and ethanol.

5. A method in accordance with claim 1, further comprising the step of hardening the porous silicon layer prior to forming the intermediate device.

6. A method in accordance with claim 5, wherein said hardening step comprises reacting the porous silicon layer with methane.

7. A method in accordance with claim 1, wherein said annealing step is performed at a temperature of about 500° C. in a nitrogen atmosphere.

* * * * *